(12) United States Patent
Esquivel et al.

(10) Patent No.: US 7,634,243 B1
(45) Date of Patent: Dec. 15, 2009

(54) SYSTEM AND METHOD FOR PROVIDING A DUAL CONVERSION TUNER HAVING A FIRST IF FILTER WITHOUT FIXED CENTER FREQUENCY

(75) Inventors: Jose L. Esquivel, Plano, TX (US); R. William Ezell, Wylie, TX (US); Jan-Michael Stevenson, Frisco, TX (US)

(73) Assignee: Microtune (Texas), L.P., Plano, TX (US)

( * ) Notice: Subject to any disclaimer, the term of this patent is extended or adjusted under 35 U.S.C. 154(b) by 1364 days.

(21) Appl. No.: 10/174,726

(22) Filed: Jun. 19, 2002

(51) Int. Cl.
*H04B 1/16* (2006.01)

(52) U.S. Cl. ............ 455/209; 455/314; 455/161.1

(58) Field of Classification Search ............ 455/209, 455/314–315, 161.1–161.3, 307, 255–265; 348/732, 731
See application file for complete search history.

(56) References Cited

U.S. PATENT DOCUMENTS

| | | | |
|---|---|---|---|
| 3,805,173 A | | 4/1974 | Nakamura, et al. |
| 4,581,643 A | * | 4/1986 | Carlson .................. 348/731 |
| 4,584,715 A | * | 4/1986 | Baars et al. ............. 455/302 |
| 5,204,972 A | | 4/1993 | Hashimoto |
| 5,278,529 A | * | 1/1994 | Willems ................. 333/204 |
| 5,329,319 A | | 7/1994 | Sgrignoli |
| 5,507,025 A | * | 4/1996 | Rodeffer ................. 455/266 |
| 6,285,865 B1 | | 9/2001 | Vorenkamp et al. |
| 6,591,091 B1 | * | 7/2003 | Vorenkamp et al. ...... 455/179.1 |
| 6,714,263 B2 | * | 3/2004 | Cowley ................. 348/731 |
| 6,954,625 B2 | * | 10/2005 | Cowley ................. 455/259 |
| 6,970,689 B2 | * | 11/2005 | Khorram ............... 455/326 |
| 2002/0118308 A1 | * | 8/2002 | Dujmenovic ........... 348/731 |
| 2005/0118976 A1 | * | 6/2005 | Murakami et al. ....... 455/313 |

OTHER PUBLICATIONS

International Search Report dated Oct. 29, 2003, PCT/US03/18160.
T. Okanobu, et al.: "An AM/TV/FM Stereo Radio IC Including IF Filters For A DTS," IEEE, Jun. 11, 1997, pp. 286-287.

* cited by examiner

*Primary Examiner*—Lana N Le
(74) *Attorney, Agent, or Firm*—Fulbright & Jaworski L.L.P.

(57) ABSTRACT

Disclosed are systems and methods which utilize a relatively low cost first IF filter in a dual conversion tuner circuit. A preferred embodiment first IF filter is provided using a filter arrangement having a relatively high tolerance. Accordingly, preferred embodiment systems are designed such that they can accommodate the range of first IF frequencies that the large tolerance filter may provide. One aspect of this accommodation may include providing a means by which the system may detect the location of the passband of the IF filter in the spectrum. Another aspect of the accommodation for the range of first IF frequencies may include adjusting the first IF frequency utilized by the dual conversion tuner to match the passband of the IF filter. Additionally or alternatively, the passband of the first IF filter itself may be tuned, such as to provide a passband more near a desired IF frequency.

28 Claims, 2 Drawing Sheets

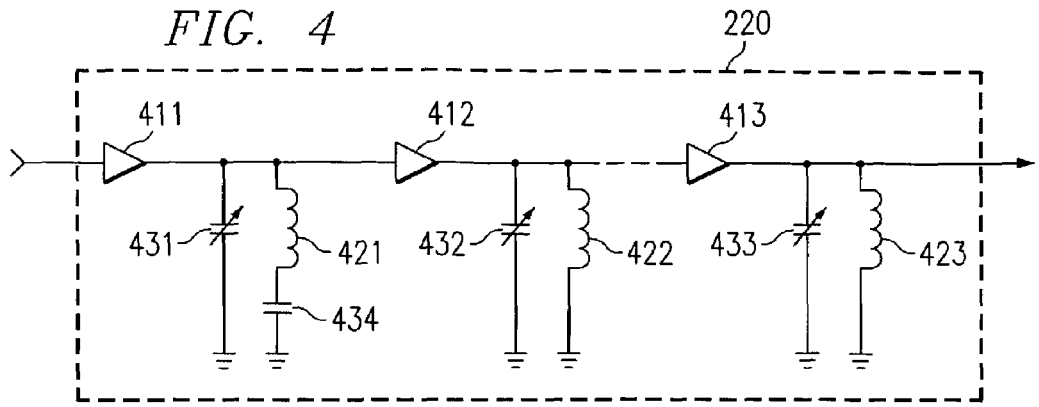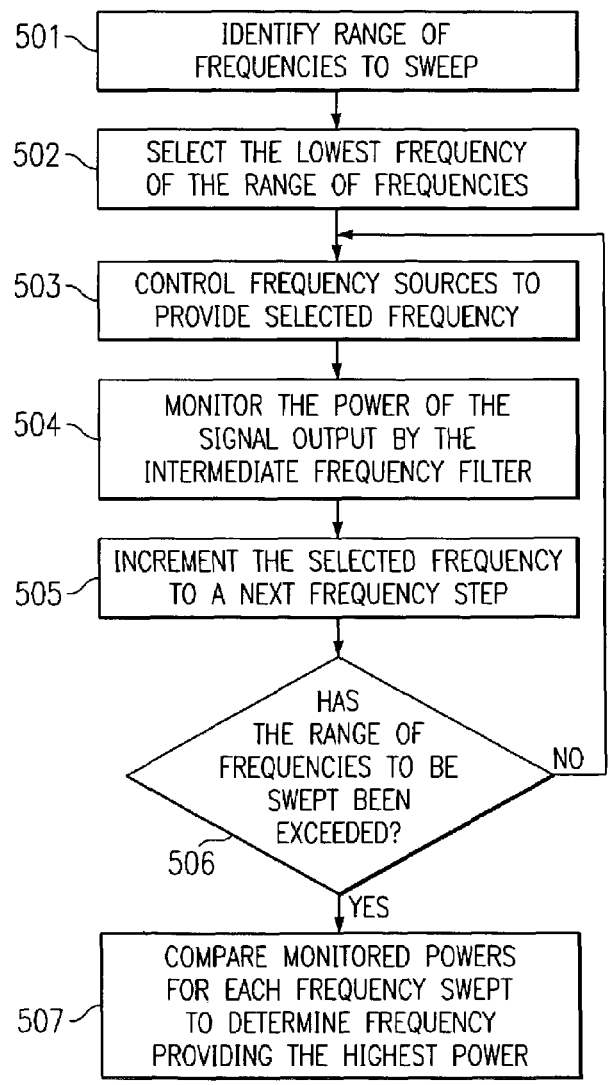

SYSTEM AND METHOD FOR PROVIDING A DUAL CONVERSION TUNER HAVING A FIRST IF FILTER WITHOUT FIXED CENTER FREQUENCY

BACKGROUND OF THE INVENTION

Dual conversion tuners have been implemented in providing tuning with respect to broadband signals for a number of years. Typically, the signal input to such a dual conversion tuner is a radio frequency (RF) signal which must be converted to a particular frequency, e.g., baseband frequency, for further signal processing. For example, it is not uncommon to utilize a dual conversion tuner, having a up-converter (mixer providing conversion of an RF input signal to a first intermediate frequency (IF)) and a down-converter (mixer providing conversion of the first IF to a second IF or a baseband signal), in a cable television set-top box to provide tuning with respect to a single cable television channel from a broadband cable signal including one hundred or more cable television channels.

In order to accommodate a broadband signal and provide a desired level of isolation with respect to a particular signal therein, various filters may be implemented with respect to a dual conversion tuner. For example, a common technique is to provide a first IF filter in the signal path between the up-converter and the down-converter. Other filters may additionally be used, such as a second IF filter coupled to the output of the down-converter to provide filtering of images or other spurious signals.

In typical prior art implementations, the aforementioned first IF filter has a precise (low tolerance) and fixed center frequency. Such a first IF filter configuration is utilized in order to provide an extremely high quality (Q) factor filter (providing sharp cutoff characteristics) having a very narrow bandwidth. Accordingly, the first IF filter may be utilized to filter unwanted channels of a broadband input signal in order that the down-converter portion of dual conversion receiver may provide linearity over a relatively small spectrum, e.g. three cable television channels, in contrast to the up-converter portion of the dual conversion receiver's ability to handle the full input spectrum.

The tolerance of the first IF filter in the aforementioned prior art configuration must typically be very low (the center frequency must be very close to a selected frequency) in order to avoid substantial attenuation of a desired signal associated with the sharp cutoffs of the pass band. For example, if the first IF is selected to be 1,250 MHz, a high tolerance first IF filter might provide a center frequency appreciably divergent from this selected center frequency (e.g., 1,100 MHz) and, therefore, a desired channel of the broadband input signal may be up-converted to 1,250 MHz only to be greatly attenuated (e.g., on the order of 40 to 50 dB) by the sharp cutoff characteristics of the first IF filter. Such a situation is very undesirable from system noise performance perspective.

In order to provide a filter having an extremely high Q factor and very narrow bandwidth with a precise center frequency, a surface acoustical wave (SAW) or ceramic resonator structure are often used. However, these filter implementations, by their very nature, are not provided on a same substrate as the aforementioned up-converter and/or down-converter, thereby making a fully integrated tuner solution impossible where such filters are used. Moreover, these filter implementations typically require significant expense in packaging the filters themselves as well as appreciable resources, e.g., circuit board space and power, in order to deploy them. SAW filters, for instance, typically require very tightly controlled, hermetically sealed packaging and are very temperature and pressure dependent. Accordingly, the packaging associated with such filters generally has an extremely high cost associated therewith.

Further adding to the cost of such filters are the costs associated with providing a precise center frequency. In addition to the costs involved in providing such a high quality filter, cost issues are presented by the yield factor associated with manufacturing such precise filters. For example, because the center frequency of the filter is required to be so accurate, a number of filters manufactured will be unusable because their center frequency falls outside the tolerance of the filter.

Implementing a discrete component filter to meet the above first IF filter performance characteristics, such as using a printed circuit (PC) board, also results in difficulty. For example, a PC board implementation, utilizing discrete inductors (such as may be printed upon a typical PC board) and/or capacitors (such as may be provided as manufactured packages), may be a relatively large, usually difficult to tune, solution. Discrete capacitors often introduce tolerances as large as 5 or 10%, depending on the technology used. The tolerance of such components carries through to the tolerance of the first IF filter, resulting in an implementation of the first IF filter having a relatively large tolerance. Similarly, inductors utilized in such a discrete component filter configuration present tolerance issues with respect to the filter. For example, inductors may be printed on a typical PC board, such as using a ¼ wavelength resonator. The ¼ wavelength resonators will resonate at particular frequencies which are directly related to the tolerance of the PC board manufacturing process. Although the tolerance of the PC board manufacturing process can be very tightly controlled at an expense, implementing ¼ wavelength resonators will nonetheless require a relatively large surface area for deployment. Accordingly, a small footprint tuner, such as may be required by some of today's electronic component requirements, may not be possible with such an implementation. Moreover, the tolerances of the individual components may result in a filter configuration which must be individually tuned in order to provide a desired center frequency.

Filters might be implemented in an integrated circuit, such as upon a same substrate as the aforementioned up-converter and down-converter; however an on-chip first IF filter produced on silicon presents issues very similar to those of the PC board implementation discussed above. Moreover, the components used to make the filter, such as on-chip capacitors and on-chip inductors, have very wide tolerances, typically appreciably more so than those of the PC board components discussed above. For example, capacitors implemented in silicon sometimes will present tolerances on the order of ±20%. However, such integrated circuit filter implementations typically are not tunable. Moreover, integrated circuits generally do, not provide sufficient available space in which to implement particular components, such as the aforementioned ¼ wavelength resonators, often resulting in Q factor issues with respect to the resulting filter.

It should be appreciated that in addition to the above mentioned difficulties associated with each particular filter implementation, the operating characteristics of such filters tends to drift over time. In the past, there has been no technique by which to detect a shift in the center frequency of such a filter and to compensate for such a change.

BRIEF SUMMARY OF THE INVENTION

The present invention is directed to systems and methods which utilize a relatively low cost first IF filter in a dual conversion tuner circuit. According to a preferred embodiment of the present invention, a first IF filter is provided using a filter arrangement having a relatively high tolerance (relatively imprecise center frequency). For example, a configuration of components implemented in silicon (preferably upon a common substrate with other portions of the dual conversion tuner circuit) may be utilized which result in filters having a center frequency varying from a desired center frequency on the order of ±10%. Similarly, a configuration of components implemented upon a printed circuit board (PCB) may be utilized which result in filters having a center frequency varying from a desired center frequency on the order of ±7%.

In accommodating a preferred embodiment first IF filter, embodiments of the present invention are adapted to overcome the relatively large tolerances associated with the filter. In other words, preferred embodiment systems are designed such that they can accommodate the range of first IF frequencies that the large tolerance filter may provide. One aspect of this accommodation may include providing a means by which the system may detect the location of the passband of the IF filter in the spectrum, e.g., by detecting the center frequency of the first IF filter. Detection of the location of the passband of the IF filter may be implemented in a number of ways according to the present invention, including both an integrated chip solution (preferably disposed upon a same substrate as other components of the dual conversion tuner) and a discrete solution.

Another aspect of the accommodation for the range of first IF frequencies may include adjusting the first IF frequency utilized by the dual conversion tuner to match the passband of the IF filter. This implementation is particularly desirable in an integrated circuit configuration wherein tuning of the first IF filter may be difficult. Additionally or alternatively, the passband of the first IF filter itself may be tuned, such as to provide a passband more near a desired IF frequency. Each such accommodation technique may utilize the aforementioned passband location detection scheme.

It should be appreciated that use of a higher tolerance first IF filter provides cost advantages in manufacturing the first IF filter. However, such cost advantages are not the only advantages provided according to the present invention. For example, by relaxing the requirements of the first IF filter, the number of components comprising the filter and/or the precision of these components may be reduced. Accordingly, first IF filters of the preferred embodiment of the present invention provide a significant size reduction over those of the prior art. Such size reductions may be particularly desirable in an integrated solution, wherein all or substantially all of the dual conversion tuner is implemented on a single substrate. In addition, once the first IF filter is provided on a same chip as the components coupled thereto, there are significant power benefits which may be realized.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIG. 4 shows an embodiment of a first intermediate frequency filter as may be used in the dual conversion tuner of FIG. 2; and FIG. 5 shows a flow diagram providing frequency sweeping according to a preferred embodiment of the present invention.

DETAILED DESCRIPTION OF THE INVENTION

Figure 1:
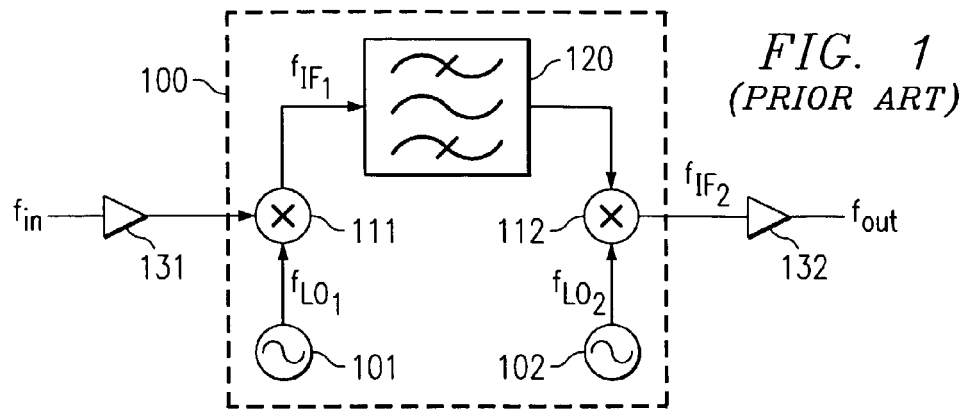
FIG. 1 shows a conventional dual conversion tuner.

In order to better understand the present invention, a brief description of a typical dual conversion tuner shall be provided with reference to FIG. 1. A conventional dual conversion tuner is shown in FIG. 1 as tuner 100. Tuner 100 may be coupled to a source signal, such as that provided from a television cable plant or an antenna (both not shown). This signal may be manipulated for processing by tuner 100, such as by amplification of the signal by low noise amplifier (LNA) 131.

Tuner 100 comprises mixers 111 and 112, here an up-converter and down-converter respectively. The source signal, as imposed on carrier frequency $f_{in}$, is injected into mixer 111 for up-conversion to a first, fixed, intermediate frequency (IF), denoted here as $f_{IF1}$. Accordingly, mixer 111 is driven by frequency source 101, here a local oscillator (LO) providing LO frequency $f_{LO1}$. Mixer 111 outputs the signal, converted from frequency $f_{in}$ to $f_{IF1}$, to first IF filter 120, which is a filter having a very high Q factor and a precise center frequency. Specifically, the center frequency, $f_{IF1}$, is selected to specifically correspond to the first IF, $f_{IF1}$. The filtered signal output from first IF filter 120 is provided to mixer 112 for down-conversion. Mixer 112 is driven by frequency source 102, which like that used in mixer 111 is a LO here providing LO frequency $f_{LO2}$. Mixer 112 outputs the signal, converted from frequency $f_{IF1}$ to $f_{IF2}$, as an output of tuner 100.

The signal as output by tuner 100 may be further manipulated after output from tuner 100, such as by amplification of the signal by second IF amplifier 132. In the illustrated example the signal output from tuner 100 is not further frequency converted by the components represented and, thus, it should be appreciated that $f_{IF2}$ corresponds to a same frequency as $f_{out}$.

In operation of tuner 100, depending on the frequency of the desired input signal $f_{in}$, e.g., the desired channel of a range of cable television channels input to tuner 100, frequency source 101 produces a frequency $f_{LO1}$ corresponding to the first intermediate frequency such that $f_{IF1}=f_{LO1}-f_{in}$. Similarly, frequency source 102 produces a frequency $f_{LO2}$ corresponding to the second intermediate frequency such that $f_{IF2}=f_{IF1}-f_{LO2}$.

As mentioned above, $f_{IF1}$ is a fixed frequency and does not change. Similarly, $f_{out}$ is a fixed frequency and does not change. For example, for a typical cable modem implementation, $f_{IF1}$ may be fixed at approximately 1,250 MHz and $f_{out}$ fixed at approximately 44 MHz. In a cable television environment, the signal input to tuner 100 may include channels ranging from approximately 50 MHz to approximately 850 MHz. Accordingly, depending upon the particular channel to be tuned to, $f_{LO1}$ may be controlled to be anywhere in the range of approximately 1,300 MHz to approximately 2,100 MHz while $f_{LO2}$ is held at approximately 1,206 MHz.

It should therefore be appreciated that in the general dual conversion tuner of the prior art, the only frequency source of the dual conversion tuner that provides variable frequencies is the first LO. Moreover, adjustment of the frequency source frequency must be provided according to a very specific formula based only on the frequency of an input signal to be tuned.

In order to provide desired operation of tuner 100, first IF filter 120 must provide a relatively high quality (Q) factor as image frequencies may appear very near the fixed first IF frequency which are advantageously removed from the signal stream prior to further manipulation of the signal by mixer 112. Moreover, due to the large number of relatively closely spaced channels in the input signal stream in a typical television signal environment, a high Q factor IF filter is desired to allow the implementation of a second mixer having desired linearity attributes. However, in the above described dual conversion tuner implementation, such a high Q IF filter requires a very precise and fixed center frequency for the filter in order to avoid undesired attenuation of a desired signal passed therethrough.

Figure 2:
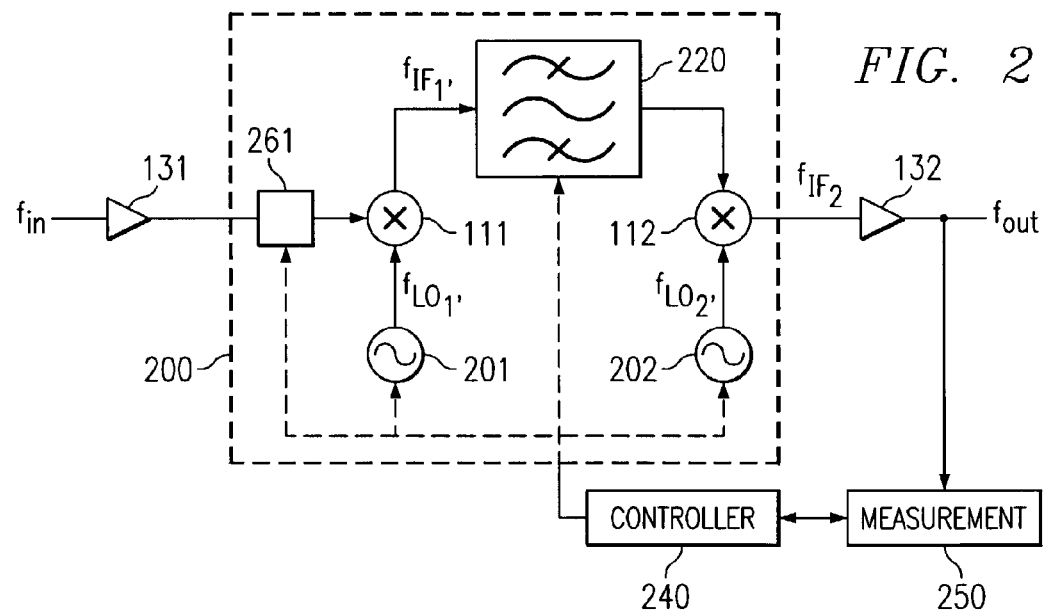
FIG. 2 shows a dual conversion tuner adapted according to a preferred embodiment of the present invention.

FIG. 2 shows a block diagram of a dual conversion tuner adapted according to a preferred embodiment of the present invention. Tuner 200 of the preferred embodiment contains circuitry similar to that of tuner 100 shown in FIG. 1, in that tuner 200 comprises mixers 111 and 112, here an up-converter and down-converter respectively, and the source signal, as imposed on carrier frequency $f_{in}$, is injected into mixer 111 for up-conversion to a first IF, denoted here as $f_{F1}$. However, the first IF, $f_{IF1}$, is not a precisely fixed frequency as in the prior art because preferred embodiment first IF filter 220 provides a relatively high tolerance filter, e.g., provides a center frequency in the range of ±7% or ±10% of a desired center frequency depending upon the implementation, such as may result from manufacturing tolerances, an implementation using fewer components to form the filter, and/or using components having higher tolerances. Although providing a passband which may be imprecise, first IF filter 220 of the preferred embodiment provides a relatively high or moderate Q factor filter, such as a filter substantially only passing 3 channels (e.g., 18 MHz) of a cable television spectrum.

Figure 3:
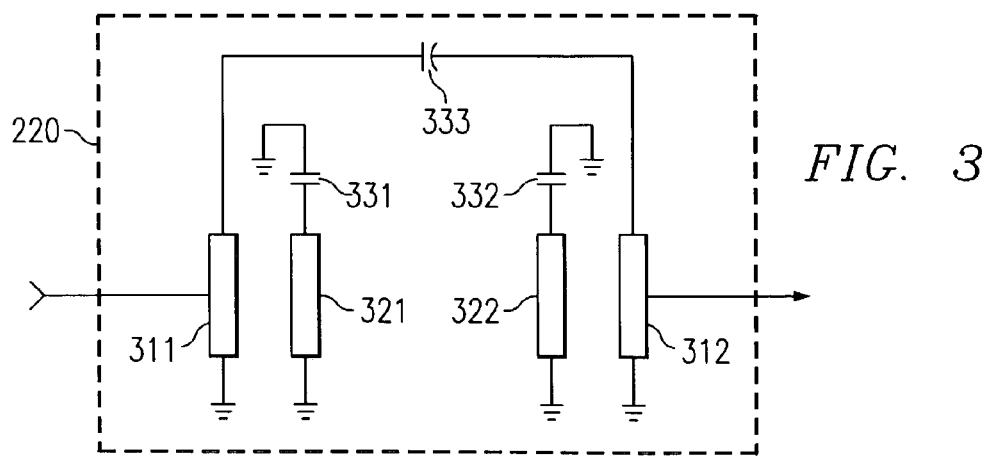
FIG. 3 shows an embodiment of a first intermediate frequency filter as may be used in the dual conversion tuner of FIG. 2.

Preferred embodiment first IF filter configurations providing attributes desirable according to the present invention are shown in FIGS. 3 and 4. Specifically, a first IF filter used in a double conversion tuner according to a preferred embodiment of the present invention is preferably a bandpass filter, having a moderate Q to limit the number of channels that are input into the second mixer, and having the ability to reject the image frequency. Preferably, implementation of a preferred embodiment first IF filter provides a filter which is relatively small in size and which uses relatively few external components. Accordingly, the IF filter of FIG. 3 provides a PC board implementation embodiment of a bandpass, moderate Q, filter with a notch response at an image frequency. The IF filter of FIG. 4 provides an integrated circuit implementation embodiment of a bandpass, moderate Q, filter which may implement various numbers of stages and may include Q compensation and/or a notch at an image frequency.

It should be appreciated that, in order to implement a PC board implementation of an IF filter tuned for approximately 1,250 MHz using a ¼ wavelength resonator, a resonator having a relatively large dimension, such as approximately 2 inches, would typically be required. However, such a configuration is not well suited for a low cost implementation, both because of the amount of area required and the precision by which the various components must typically be manufactured. In order to address the relatively large size of typical PC board configurations, the first IF filter configuration of FIG. 3 utilizes smaller resonators with capacitors selected to cause the smaller resonators to resonate approximately at a desired frequency (the first IF frequency).

For example, first IF filter 220 as shown in FIG. 3 may be comprised of FR4 printed circuit board material providing multiple circuit layers. Resonators 311, 312, 321, and 312, such as may be comprised of copper printed circuit board traces, may be sized so as to correspond with a frequency considerably higher than a desired first IF frequency. For example, where resonators 311, 312, 321, and 322 are sized to correspond with a frequency on the order of 2 to 3 times a 1,250 MHz first IF frequency, the length of these resonators may be on the order of one to two-tenths of an inch, as opposed to approximately two inches, with the width of the copper traces being approximately 10 mils. At the desired IF, the resonators become inductors which are magnetically coupled as a function of their spacing on the PC board. These inductor may be tuned using a capacitor in parallel.

Accordingly, capacitors 331 and 332 are coupled to resonators 321 and 322 respectively to tune the frequency at which the corresponding resonators resonate. Preferably, such capacitors are provided in a small form factor, such as the 0402 type or 0603 type capacitors commercially available today. Commercially available capacitors are typically of a tolerance of anywhere from 5 to 10%, depending on cost and other characteristics. Accordingly, it should be appreciated that even choosing a 5% tolerance capacitor, the resonator configuration of FIG. 3 will typically introduce an appreciably large frequency range associated with the center frequency of the filter.

Capacitor 333 of the illustrated embodiment is provided coupled to resonators 311 and 312 to control the image frequency rejection. Use of a properly selected value with respect to capacitor 333, along with the spacing between resonators, may be utilized to define the amount of rejection to the image frequency.

Referring now to FIG. 4, a preferred embodiment first IF filter which may be implemented in an integrated circuit embodiment, such as may be disposed on a same silicon substrate as mixer 211 and 212, is shown. It should be appreciated that the first IF filter may be implemented in any number of ways on silicon. For example, the filter may be passive or active, it may be a ladder filter or a series of cascade bi-quads of any number of stages, and/or it may include one or more zeros at the image frequency to provide image rejection.

A preferred embodiment "on-chip" implementation as shown in FIG. 4 comprises a three stage cascaded bi-quad, thereby providing a $6^{th}$ order filter. However, alternative embodiments may comprise more or less stages as determined to provide a filter of desired characteristics. As shown in FIG. 4, transconductance amplifiers provided using bi-quad inductor capacitor (L-C) filter sections are coupled in cascade. Preferably the gain of each such transconductance amplifier is selected to cooperate with the remaining cascaded amplifiers and provide filtering with respect to a desired IF. For example, the gain of each of amplifiers 411, 412 and 413, $gm_1$, $gm_2$, and $gm_N$ respectively, may include image frequency zeroing and/or some active Q compensation. The different bi-quad stages may also be incorporated as part of other tuner blocks, e.g., the first stage could be part of up-conversion mixer 111 of FIG. 2.

The frequency response of each filter stage is preferably controlled through the use of the capacitors and inductors coupled thereto. For example, the illustrated embodiment includes capacitor 431 and inductor 421 coupled to the output of amplifier 411 of the first filter stage, capacitor 432 and inductor 422 coupled to the output of amplifier 412 of the second filter stage, and capacitor 433 and inductor 423 coupled to the output of amplifier 413 of the third filter stage. Inductors 421-423 may be provided in various embodiments, including being disposed in silicon and/or comprised of bond wire inductors. Similarly, capacitors 431-423 may be provided in various embodiments, including the use of tunable and/or fixed capacitors.

Capacitor 434 shown in the first stage of IF filter 220 provides a zero to produce a notch at an image frequency. It should be appreciated that such a capacitor may be disposed in any or all of the stages of an IF filter of the present invention. Likewise, such a capacitor may be omitted from an IF filter of the present invention, if desired.

The use of variable capacitors as shown in the embodiment of FIG. 4 allows for the adjustment of the center frequency of the filter, as will be described in further detail below. Accordingly, the first IF passed by filter 220 of FIG. 4 may be changed. However, a disadvantage of such an implementation is that since this is an active implementation, it may have noise and distortion requirements that a passive filter would not have.

It should be appreciated that the use of the illustrated embodiment integrated circuit implementation of the first IF filter is likely to provide a bandpass filter with a moderate Q and with a somewhat unpredictable center frequency. On the other hand, such an embodiment does not require the up-converter to drive components "off-chip" and, therefore, may be utilized to provide a lower power implementation. Additionally, preferred embodiment integrated circuit implementations present a very small filter solution which may be utilized to provide a correspondingly small dual conversion tuner implementation.

Tuner 200 is preferably adapted to accommodate preferred embodiment relatively high tolerance first IF filter 220. Such accommodation may preferably include providing a means by which the system may detect the location of the passband of first IF filter 220, e.g., by detecting the center frequency of the first IF filter, adjusting the first IF frequency utilized by the dual conversion tuner to match the passband of first IF filter 220, and/or tuning the passband of first IF filter 220.

Preferred embodiment adaptation of tuner 200 according to the present invention includes controller 240 coupled thereto. Controller 240 is preferably coupled to one or more of the components of tuner 200, such as frequency source 201, frequency source 202, first IF filter 220, and/or controllable signal path 261. Controller 240 preferably provides control signals to components of tuner 200 coupled thereto in order to facilitate operation thereof as described herein. Various other components, such as measurement device 250, may be coupled to controller 240 for facilitating operation as described herein, such as to provide information with respect to the operation of tuner 200 or aspects thereof.

It should be appreciated that controller 240 may be implemented upon a same substrate as tuner 200. For example, controller 240 may be implemented as an application specific integrated circuit (ASIC) or other state-machine on the same substrate as an integrated circuit implementation of tuner 200, if desired. Additionally or alternatively, controller 240 may be implemented utilizing a suitable processor (not shown) operating under executable instructions according to embodiments of the present invention. For example, the processor of controller 240 may execute software and/or firmware instructions that implement processes according to embodiments of the present invention described herein. The software and/or firmware instructions may be stored on any suitable computer-readable medium such as PROM, EPROM, EEPROM, hard disk medium, optical disk medium, and/or the like that is accessible by controller 240.

Measurement device 250 of the preferred embodiment comprises a signal attribute detection source coupled in the signal path after first IF filter 220. For example, measurement device 250 may comprise a signal power measurement circuit, as are well known in the art, coupled to the output of second IF amplifier 132 for measuring the energy envelope of signals at frequency $f_{IF2}$. Alternative embodiments of the present invention may provide coupling of measurement device 250 at different points in the signal path, such as at the output of mixer 112 and/or at the output of first IF filter 220. However, preferred embodiments couple measurement device 250 at a point in the signal path after frequency conversion of the signal by mixer 112 to simplify operation thereof. Specifically, as the center frequency of first IF filter 220 of the preferred embodiment is imprecise, coupling measurement device 250 to the output thereof, without the intervention of mixer 112, may require measurement scanning of various frequencies in order to provide desired information with respect to the operation of first IF filter 220, further complicating the configuration of measurement device 250.

It should be appreciated that all or some of the illustrated components of tuner 200 may be implemented using integrated circuit technology, preferably all being disposed upon a common integrated circuit substrate. For example, the relatively large tolerance with respect to the center frequency of preferred embodiment first IF filter 220 facilitates an integrated circuit implementation thereof. Likewise, other components utilized in cooperation with tuner 200 may be implemented using integrated circuit technology, such as LNA 131 and/or second IF amplifier 132, perhaps also being disposed upon a same substrate as tuner 200. Accordingly, it should be appreciated that controller 240 and/or measurement device 250, although illustrated as separate from tuner 200, may be implemented using integrated circuit technology, preferably being disposed upon a same substrate as tuner 200.

In operation of tuner 200, much like tuner 100 described above, mixer 111 is driven by frequency source 201, here a LO providing LO frequency $f_{LO1'}$. Mixer 111 outputs the signal, converted from frequency $f_{in}$ to $f_{IF1'}$, to first IF filter 220, which is a preferably a filter having a relatively high Q factor although having a relatively imprecise center frequency. Accordingly, the center frequency, $f_{IF1'}$, is not precisely established upon manufacturing of first IF filter 220 and, therefore, may not specifically correspond to a particular first IF, $f_{IF1'}$. The filtered signal output from first IF filter 220 is preferably provided to mixer 112 for down-conversion. Mixer 112 is driven by frequency source 202, which like that used in mixer 111 is a LO, here providing LO frequency $f_{LO2'}$. Mixer 112 preferably outputs the signal, converted from frequency $f_{IF1}$ to $f_{IF2}$, as an output of tuner 200. It should be appreciated that the output signal $f_{IF2}'$ may be an intermediate frequency signal subject to further frequency conversion or may be a baseband signal, such as may be demodulated to extract information carried therein.

Controller 240 of the preferred embodiment is operable to detect the location of the passband of first IF filter 220, e.g., by detecting the center frequency of the first IF filter, using information with respect to the operation of first IF filter 220 provided by measurement device 250. For example, in operation according to a preferred embodiment, controller 240 may control controllable signal path 261 to substantially isolate tuner 200 from an input signal, e.g., $f_{in}$. Additionally or alternatively, controllable signal path 261 may be controlled to allow the LO signal of frequency source 201 to bypass mixer 111. Thereafter, controller 240 may control frequency source 201 to sweep through a selected range of frequencies, such as may span a frequency range encompassing an expected possible range of center frequencies of first IF filter 220. It should be appreciated that, as mixer 111 has been isolated from the input signal $f_{in}$ and/or is bypassing mixer 111, a signal based upon the signal from frequency source 201, $f_{LO1'}$, will be provided to first IF filter 220. Accordingly, a frequency sweep signal provided by frequency source 201, under control of controller 240, is provided to first IF filter 220.

While the frequencies are being swept according to the preferred embodiment, controller 240 preferably controls measurement device 250 to monitor the signal stream passed by first IF filter 220 to detect the response of first IF filter with respect to the frequencies being swept. For example, measurement device 250 may monitor the signal stream passed by first IF filter 220 (after processing by mixer 112 and frequency source 202) to detect a particular frequency provided by frequency source 201 having the highest amplitude response, or the most power out, from first IF filter 220.

A flow diagram illustrating the steps of a preferred embodiment frequency sweep algorithm according to the present invention is shown in FIG. 5. At step 501 of FIG. 5, a range of frequencies to be swept is preferably identified. This range of frequencies is preferably selected based upon an expected range of center frequencies possible from first IF filter 220. For example, where a desired center frequency is approximately 1,250 MHz, and first IF filter 220 provides a filter tolerance of ±10%, the range of frequencies to be swept may be from approximately 1,100 MHz to approximately 1,400 MHz.

At step 502, the lowest frequency of the sweep range is preferably selected. Thereafter, the frequency source is preferably controlled to provide the selected frequency (step 503) and the power of the signal output by the first IF filter is preferably monitored (step 504). Having monitored the response of the first IF filter to the selected frequency, the selected frequency is preferably incremented to a next frequency (step 505). Incrementing of the sweep frequency is preferably provided in small frequency steps, such as those associated with the resolution of frequency source used. For example, a preferred embodiment LO provides frequency synthesis resolution on the order of 1 MHz.

At step 506, a determination is preferably made as to whether the range of frequencies to be swept has been exceeded. If the range of frequencies to be swept has not been exceeded, processing preferably returns to step 503 for control of the frequency source to provide the selected frequency. However, if the range of frequencies to be swept has been exceeded, processing preferably proceeds to step 507 wherein the power levels output from the first IF filter with respect to each frequency swept are compared to determine the sweep frequency associated with the highest power level. This frequency is preferably identified as the center frequency of the first IF filter and the first IF frequency, $f_{IF1'}$, is preferably established accordingly.

The steps of FIG. 5, and/or corresponding control of tuner 200 to identify an optimal center frequency, may be performed at one or more times throughout the life of tuner 200. For example, the steps of FIG. 5 may be performed upon initialization of tuner 200 for operation. Additionally or alternatively, the steps of FIG. 5 may be performed periodically, such as upon system power-up, upon a reset or reinitialization condition, after a predetermined amount of time has elapsed, upon detection of non-optimum operation, and/or the like. Accordingly, the preferred embodiment may operate to initially configure operation of tuner 200 as desired and/or may operate to periodically reconfigure tuner 200 to accommodate changes associated with time, environment, etcetera.

It should be appreciated that, in conventional operation, frequency source 101 of tuner 100 need only provide a first LO frequency that is equal to the first IF frequency plus the input signal frequency being tuned. For example, for an input frequency range of 50 MHz to 850 MHz where the first IF is 1,250 MHz, frequency source 101 may be required to provide LO frequencies in the range of from 1,300 MHz (1,250 MHz+50 MHz) to 2,100 MHz (1,250 MHz+850 MHz). However, in order to provide the preferred embodiment frequency sweeping, frequency source 201 preferably provides frequencies beyond this typical range of frequencies. Again considering an input frequency range of 50 MHz to 850 MHz where the first IF is desired to be approximately 1,250 MHz, but the first IF filter is implemented with a 10% tolerance, the first IF may be in the range of 1,125 MHz to 1,375 MHz. Instead of frequency source 201 providing frequencies in the range of from 1,300 MHz to 2,100 MHz as in the conventional implementation, frequency source 201 preferably provides frequencies in excess of 2,100 MHz, such as at least to 2,225 MHz, and frequencies less than 1,300 MHz, such as at least to 1,175 MHz, to provide a sweep frequency at the worst expected cases with respect to first IF filter 220. Of course, frequency source 201 may be adapted to provide frequencies even beyond this range, such as to accommodate some level of variance beyond the expected tolerance levels, if desired.

Moreover, it should be appreciated that the LO signal provided by frequency source 101 is typically a relatively powerful signal, in order to drive mixer 111 for outputting a proper frequency to first IF filter 120. However, when providing a sweep frequency, such as that described above with respect to FIG. 5, it is preferred that frequency source 201 may be controlled to provide a relatively low power signal so as not to saturate or overload mixer 112 once it receives the sweep signal through first IF filter 220. Accordingly, in addition providing the LO frequency of frequency source 201 without mixing with an input signal, preferred embodiments of the present invention include control of frequency source 201, such as by controller 240, to reduce the output power to a range that mixer 112 can tolerate without saturation. Measurement device 250 of the preferred embodiment is optimized, preferably including consideration of the power levels to be output by frequency source 201, for operation with respect to tuner 200.

Having identified the first IF filter's center frequency, such as utilizing the preferred embodiment sweep method described above with respect to FIG. 5, operation of the up-converter may be adjusted accordingly. For example, the LO frequency of frequency source 101 of a conventional dual conversion tuner may provide a range of frequencies corresponding to the input frequency band, generally 50 MHz to 850 MHz for cable television signals, plus the center frequency of first IF filter 120, often approximately 1250 MHz, thereby providing frequencies in the range of between approximately 1 and 2 GHz. In contrast, however, frequency source 201 of the preferred embodiment may be controlled by controller 240, such as by using a digital tuning scheme to adjust PLL divide ratios of the frequency source, to output a frequency corresponding to a desired input frequency, such as within the range of 50 MHz to 850 MHz for cable television input signals, plus the determined center frequency of first IF filter 220 (for high side injection) or a frequency corresponding to a desired input frequency minus the determined center frequency (for low side injection). For example, where the center frequency of first IF filter 220 is determined to be at 1,125 MHz, as opposed to a desired center frequency of 1,250 MHz, tuning to a channel at 50 MHz may be accomplished by controller 240 controlling frequency source 201 to provide a LO frequency of 1,175 MHz rather than the LO frequency of 1,300 MHz as may be provided by frequency source 101. Accordingly, the frequency provided by frequency source 201 is preferably adjusted to correspond to the detected IF filter detected center frequency, such as may be controllable through a two wire interface to controller 240, and may be programmed to any number of frequencies within its frequency range.

Correspondingly, the LO frequency of frequency source 202 may be controlled by controller 240 to correspond to an amount of variance from a desired center frequency of first IF filter 220 in order to provide a second IF at a desired frequency. For example, where the center frequency of first IF filter 220 is determined to be 1,125 MHz, rather than the desired 1,250 MHz, in addition to the aforementioned compensation of frequency source 201, frequency source 202 may be controlled to provide an LO frequency of 1,081 MHz rather than 1,206 MHz in order to provide a second IF at 44 MHz. Additionally or alternatively, controller 240 may operate to control various downstream components to operate with respect to a second IF corresponding to some or all of the measured variance of the center frequency of first IF filter 220.

It should be appreciated that, in addition to or in the alternative to the above described adjustment of frequency source 201 in accordance with the center frequency of first IF filter 220, embodiments of the present invention may operate to actively adjust the frequency response of first IF filter 220. For example, using the adjustable capacitors, such as may be provided by binary weighted arrays of inversion mode MOSFET varactors, of the embodiment of first IF filter 220 shown in FIG. 4, the filter itself may be tuned to a particular IF, perhaps a desired IF or more near a desired IF, under control of controller 240 using feedback with respect to the filter center frequency. Moreover, such an active technique may be utilized in combination with corresponding adjustment of the LO frequency or frequencies provided by frequency source 201 and/or frequency source 202, depending on a range which is required due to the process variations on the chip for example. Of course, where adjustment of the LO frequency is used to the exclusion of active adjustment of the filter, fixed capacitors may be utilized in the filter configuration of FIG. 4, if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A tuner comprising:
    a first local oscillator circuit;
    a first filter coupled to an output of said first local oscillator circuit through a mixer, wherein said first filter provides a center frequency which is not precisely predictable upon manufacture of said first filter; and
    a control system coupled to said first local oscillator circuit, wherein said control system controls said first local oscillator circuit to sweep a range of frequencies corresponding to an expected range of center frequencies of said first filter utilizing said first local oscillator circuit as the only signal input to said mixer.

2. The tuner of claim 1, wherein said control system comprises:
    a control circuit; and
    a signal attribute monitoring device, wherein said signal attribute monitoring device is adapted to monitor a signal attribute of a signal passed by said first filter and provide information with respect thereto to said control circuit.

3. The tuner of claim 2, wherein said control system comprises:
    a controllable signal path coupled to said first frequency conversion circuit.

4. The tuner of claim 3, wherein said first local oscillator circuit is part of a first frequency conversion circuit and at least a portion of said first frequency conversion circuit and at least a portion of said control system are disposed upon a same integrated circuit.

5. The tuner of claim 4, wherein said signal attribute monitoring device is disposed upon said integrated circuit.

6. The tuner of claim 4, wherein said controllable signal path is disposed upon said integrated circuit.

7. The tuner of claim 4, wherein at least a portion of said first filter is disposed upon said integrated circuit.

8. The tuner of claim 2, wherein said control circuit comprises a processor based controller.

9. The tuner of claim 2, wherein said control circuit comprises a state machine.

10. The tuner of claim 2, wherein said information provided to said control circuit by said signal attribute monitoring device comprises information with respect to a power of said signal passed by said first filter.

11. The tuner of claim 10, wherein said control circuit controls a first frequency conversion circuit including said first local oscillator circuit to adjust for said identified center frequency when providing frequency conversion of a signal input to said first frequency conversion circuit.

12. The tuner of claim 11, wherein said control circuit controls a second frequency conversion circuit to adjust for said identified center frequency when providing frequency conversion of a signal input to said second frequency conversion circuit.

13. The tuner of claim 2, wherein said control circuit correlates said information with respect to said signal passed by said first filter with a frequency of said range of frequencies swept by said first local oscillator circuit.

14. The tuner of claim 2, wherein said control circuit identifies, based at least in part on said information provided by said signal attribute monitoring device, a particular frequency of said range of frequencies swept by said first local oscillator circuit as a center frequency of said first filter.

15. The tuner of claim 14, wherein said control circuit controls said first filter to adjust said identified center frequency.

16. The tuner of claim 1, wherein at least a portion of said first local oscillator circuit and at least a portion of said control system are disposed upon a same integrated circuit.

17. The tuner of claim 16, wherein a signal attribute monitoring device of said control system is disposed upon said integrated circuit.

18. The tuner of claim 16, wherein a controllable signal path of said control system is disposed upon said integrated circuit.

19. The tuner of claim 16, wherein at least a portion of said first filter is also disposed upon said same integrated circuit.

20. The tuner of claim 1, wherein said first filter comprises:
at least one resonator having an attribute adapted for a frequency greater than said center frequency.

21. The tuner of claim 20, wherein said attribute is a length of said resonator.

22. The tuner of claim 20, wherein said frequency greater than said center frequency is at least twice said center frequency.

23. The tuner of claim 1, wherein said first filter comprises at least a moderate quality factor.

24. A method of providing a dual conversion tuner using a relatively high tolerance intermediate frequency filter, said method comprising:
providing a first frequency conversion circuit, wherein said first frequency conversion circuit comprises a first local oscillator and a first mixer;
providing a second frequency conversion circuit, wherein said second frequency conversion circuit comprises a second local oscillator and a second mixer;
providing a intermediate frequency filter having a tolerance value associated therewith, wherein said intermediate frequency filter is coupled to said first frequency conversion circuit through a first mixer and to said second frequency conversion circuit through a second mixer;
operating said dual conversion tuner in a first mode of operation comprising:
controlling said first local oscillator to step through a range of frequencies encompassing at least those frequencies varying said tolerance value from a desired frequency using said first local oscillator as a sole signal input to said first mixer;
monitoring a power level of a signal output by said intermediate frequency filter;
determining a frequency of said range of frequencies having a highest monitored power level; and
identifying said determined frequency of said range of frequencies as a pass frequency of said intermediate frequency filter; and
operating said dual conversion tuner in a second mode of operation comprising:
controlling at least one component of said dual conversion tuner as a function of said identified pass frequency.

25. The method of claim 24, wherein said first mixer, said second mixer, and said intermediate frequency filter are disposed in a same integrated circuit.

26. The method of claim 24, wherein said controlling at least one component of said dual conversion tuner comprises:
adjusting a mixing frequency provided by said first local oscillator for providing a frequency converted signal which corresponds to said identified pass frequency when said mixing frequency is mixed with a desired portion of said input signal.

27. The method of claim 24, wherein said controlling at least one component of said dual conversion tuner comprises:
adjusting said intermediate frequency filter to change a pass frequency associated therewith.

28. The method of claim 24, wherein said controlling at least one component of said dual conversion tuner comprises:
adjusting a mixing frequency provided by said second local oscillator for providing a frequency converted signal which corresponds to a desired output frequency when said mixing frequency is mixed with said identified pass frequency.

* * * * *

UNITED STATES PATENT AND TRADEMARK OFFICE
CERTIFICATE OF CORRECTION

PATENT NO. : 7,634,243 B1
APPLICATION NO. : 10/174726
DATED : December 15, 2009
INVENTOR(S) : Esquivel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1856 days.

Signed and Sealed this

Ninth Day of November, 2010

David J. Kappos
*Director of the United States Patent and Trademark Office*